United States Patent [19]

Kern et al.

[11] Patent Number: 4,814,696
[45] Date of Patent: Mar. 21, 1989

[54] METHOD AND CIRCUIT ARRANGEMENT FOR MEASURING IN-PHASE AND QUADRATURE COMPONENTS OF CURRENT IN AN ELECTRICAL ALTERNATING CURRENT POWER SUPPLY

[75] Inventors: Siegfried Kern, Freiamt; Otmar Glaser, Herbolzheim, both of Fed. Rep. of Germany

[73] Assignee: Frako, Kondensatoren-und Apparatebau GmbH, Tenigen, Fed. Rep. of Germany

[21] Appl. No.: 892,349

[22] Filed: Aug. 1, 1986

[30] Foreign Application Priority Data

Feb. 8, 1985 [DE] Fed. Rep. of Germany ....... 3527801

[51] Int. Cl.⁴ .................... G01R 19/00; G01R 19/06
[52] U.S. Cl. ................................ 324/142; 324/83 D; 324/141; 364/841
[58] Field of Search .................. 324/78, 83, 142, 141; 364/841, 844, 483

[56] References Cited

U.S. PATENT DOCUMENTS

| | | | |
|---|---|---|---|
| 4,131,847 | 12/1978 | Kohga et al. | 324/142 |
| 4,356,446 | 10/1982 | Battocletti | 324/83 R |
| 4,455,529 | 6/1984 | Sinclair | 324/83 D |
| 4,459,546 | 7/1984 | Arrington et al. | 364/841 |
| 4,492,918 | 1/1985 | Hernandez et al. | 324/83 D |
| 4,498,138 | 2/1985 | Moore | 364/841 |
| 4,556,843 | 12/1985 | Milkovic et al. | 324/142 |
| 4,584,652 | 4/1986 | Sturza et al. | 324/83 D |
| 4,615,009 | 9/1986 | Battocletti et al. | 324/141 |
| 4,672,555 | 6/1987 | Hart et al. | 364/481 |

FOREIGN PATENT DOCUMENTS 1616545  6/1971  Fed. Rep. of Germany .

OTHER PUBLICATIONS

"Power Measurement (Active or Reactive)", by Desoanx, Electron. and Appl. Ind. (France), #262S, 1/15/79, d. 324–142.

"On the Electronic Three-Phase Active and Reactive Power Measurement", by Miljanic et al., IEEE Trans. on Ins. & Meas., 12/78, vol. IM-27, #4, pp. 452–455, U. 324–142.

Pages 103 through 107 of "IEEE Transactions on Instrumentation and Measurement" (Jun.-Sept.)/64, by Drew et al.

Primary Examiner—Reinhard J. Eisenzopf
Assistant Examiner—W. Burns
Attorney, Agent, or Firm—Harness, Dickey & Pierce

[57] ABSTRACT

A method and circuit arrangement for measuring in-phase current and quadrature current in an electrical alternating current power supply is disclosed. The invention uses a microprocessor whereby four integral values $A_1$ through $A_4$ are combined in such as to allow determination of the in-phase current and the quadrature current. The invention is useful in recording in-phase and quadrature components of current from an alternating current power supply.

7 Claims, 2 Drawing Sheets

METHOD AND CIRCUIT ARRANGEMENT FOR MEASURING IN-PHASE AND QUADRATURE COMPONENTS OF CURRENT IN AN ELECTRICAL ALTERNATING CURRENT POWER SUPPLY

BACKGROUND OF THE INVENTION

This invention relates to a method and circuit arrangement for measuring the in-phase and quadrature components of current in an alternating power supply. Starting from a certain value, the consumer must assume the burden of the electric company for the use of quadrature current in an alternating current power supply. This is because the quadrature currents burden the main line. Consequently, it is necessary to measure the portions of the quadrature current. In many cases, it is just as necessary to measure the portion of in-phase current in order to determine wattage factor cost from both of these current components. From this, the circuit arrangements for the idle wattage compensation must also possess measuring equipment with which the wattage factor over the quadrature current and thereby over the corresponding live voltage and idle wattage can be determined.

Measuring tools for the recording of in-phase current and quadrature current as well as for wattage factors and costs are already established. In the book "Measure Rectifier", published by G. Braun, Karlsurule, West Germany, 1963, pages 90 and 91, such a measuring tool is described. Also, the principal circuit diagram is shown. When measuring the quadrature currents, a potential/voltage meter must be set so that the needle deviation is at a minimum. Only then can the quadrature current component read $I_b$ on the analog indicator.

In the handbook, "Electrical And Heat Technology Measurements", published by Hartman and Braun, 11th Edition, 1963, page 100, it is shown how the quadrature current and in-phase current are measured by means of a multiple instrument. Here too, with a watt voltage meter, the needle deviation must be set at the smallest amount.

In the book "Alternating Current Technology", by F. Koppelmann, 1956, pages 36 through 38, a possibility of measuring the quadrature and in-phase circuit components with a measuring contact is shown. Here, the measuring area is to be adjusted to the neutral passage of the respective component to be measured. The measured value is determined and indicated in a needle type indicator instrument. In order to keep the margin of error at the smallest level, aside from the length of time, the position of the contact phase is also especially important. Lastly, due to the measuring technology used and also because of frequently existing strong overlying components, it is very difficult to determine the in-phase and quadrature current with the necessary exactness. It is not so acceptable to use half conductor diodes in order to determine the contact phase, because the flow voltage from these diodes and the temperature influences on the one-half wave are especially disadvantageous to exact measurement.

SUMMARY OF THE INVENTION

It is a purpose of this invention to develop a method and circuit arrangement for measuring in-phase and quadrature current in an electrical alternating current power supply wherein the method is especially suited for microprocessor employment. Further, only a small element cost is necessarly and a 90 degree phase reorientation in the measuring circuit is not necessary.

These objects are solved in accordance with the invention by way of the indicated characteristics of claim 1. In the subclaims, the advantageous developments of the invention are further emphasized.

The process and circuit arrangement according to the invention are especially cost favorable by virtue of their low element costs. At the same time, they offer a higher accuracy in the measuring result. Some voltage portions, such as the offset voltage of operation boosting, will be automatically suppressed and no components are necessary for a 90 degree phase shift.

BRIEF DESCRIPTION OF THE DRAWINGS

The invention is more clearly explained by the enclosed drawings which show certain examples in FIGS. 1 through 4. In the drawings.

DETAILED DESCRIPTION OF THE PREFERRED EMBODIMENTS

Figure 1:
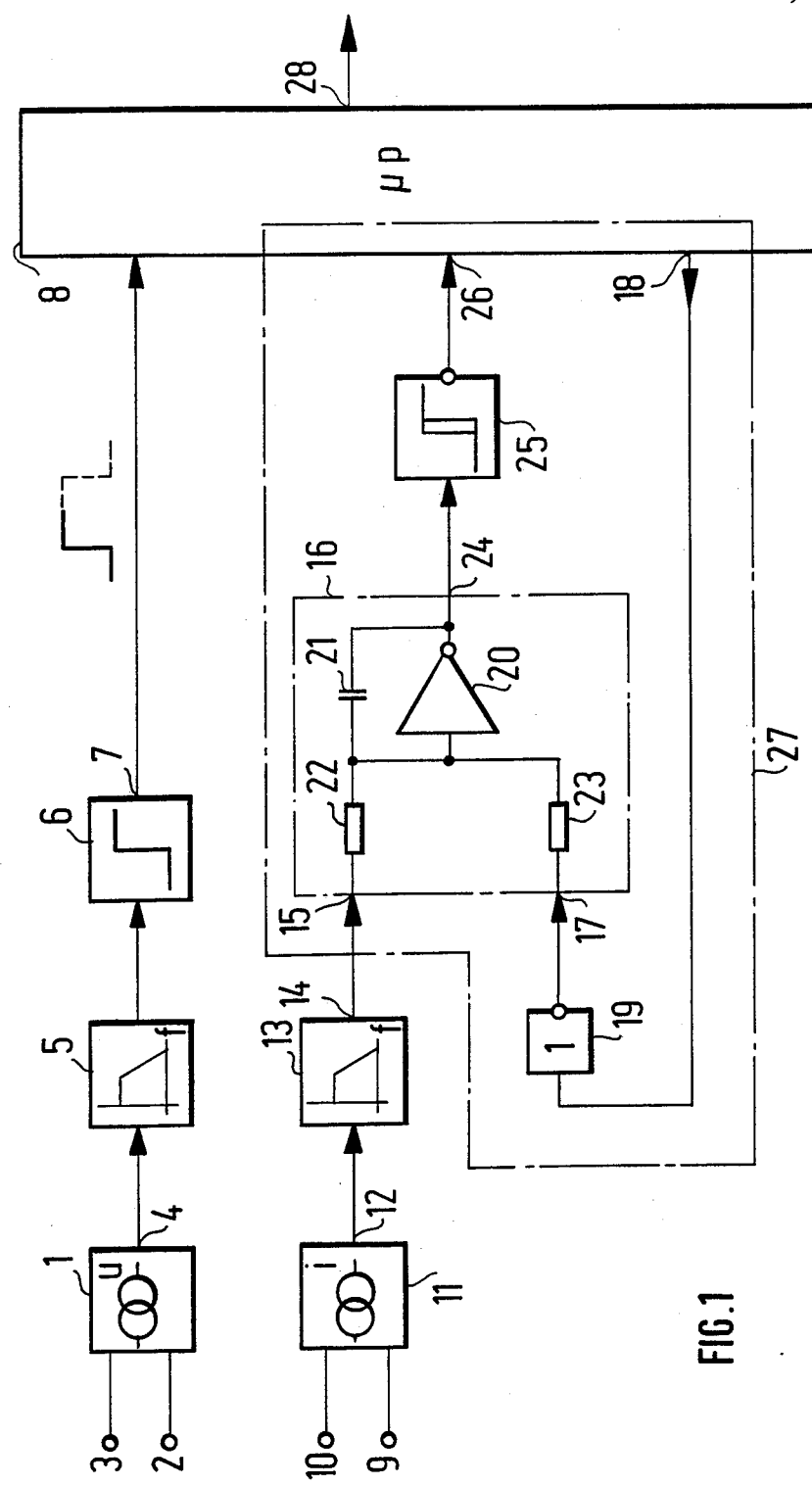
FIG. 1 shows a schematic diagram of an apparatus operating in accordance with an embodiment of the invention.

Referring first to FIG. 1, a circuit arrangement operating in accordance with the invention is illustrated. A line voltage is connected to the entry junctions 2 and 3 of a voltage transformer 1. If a three phase power supply is used, then phase junctions L2 and L3 are also superimposed. The voltage transformer 1 may use already existing transformers for the supply of the entire circuit arrangement. Further, it is is also possible to install an optical coupler as a voltage transformer. The output 4 of the transformer 1 is led to a low pass filter 5 which is connected to a comparator 6. The output signal 7 of the comparator 6 is led to a microprocessor 8. The output signal transmitted to the microprocessor by the comparator 6 (signal 7) is a square wave. Only one-half of the square wave is used for further processing and for synchronization. In the illustrated embodiment, it is the positive side of the square wave which is used. Furthermore, the exact power supply frequency can be determined by the intervals of these signals (and if need be, where there are frequency deviations which could adversely affect the measured result) there can be employed a compensating correction.

The transformer 11 has primary junctions 9 and 10 that are connected to the power supply. It also would be possible here to insert a current measuring rheostat, however, this simpler arrangement would have the disadvantage of power dependence. With a three phase current supply, a current transformer would be preferably placed in the phase L1. The output 12 of the current transformer 11 will be led through a low pass filter 13 which is identical to the voltage pass. It is thereby guaranteed that the various power supply frequencies and phase frequencies in the voltage path and current path are the same. The output 14 of the low pass filter 13 is connected to terminal 15 of a summation integrator, indicated generally by the block 16. An output port 18 of the microprocessor 8 inputs to a second input terminal 17 of the summation integrator 16 through an inverter 19. The summation integrator 16 is constructed in a known manner with an amplifier 20, integrating capacitor 21 and fixed resistors 22 and 23 of equal value. A negative schmitt trigger 25 is connected to the output 24 of the summation integrator 16. The schmitt trigger 25 has its signal transmitted to a inlet port 26 of the microprocessor 8. The summation integrator 16, schmitt trigger 25 and inverter 19 comprise, in conjunction with the microprocessor 8, an analog/digital transformer as indicated by the block 27.

The microprocessor 8 includes a driver for a 7 segment LED signal connected over output ports 28 (schematically indicated in the drawings), which depending upon the program request, report the in-phase current, quadrature current and even the wattage factor cos $\phi$. The value themselves are relayed by the processing method according to the invention.

The request for the appropriate signal results over the inlet ports of the microprocessor (which are not represented in the drawings) on which sensors are connected for this application. Further, it is also possible to use the determined values of quadrature current and wattage factor in a regulator switch for an quadrature current compensation. A positive representation of these switching components will be dispensed with here because they are not necessary for those skilled in the art to understand the invention.

Figure 2:
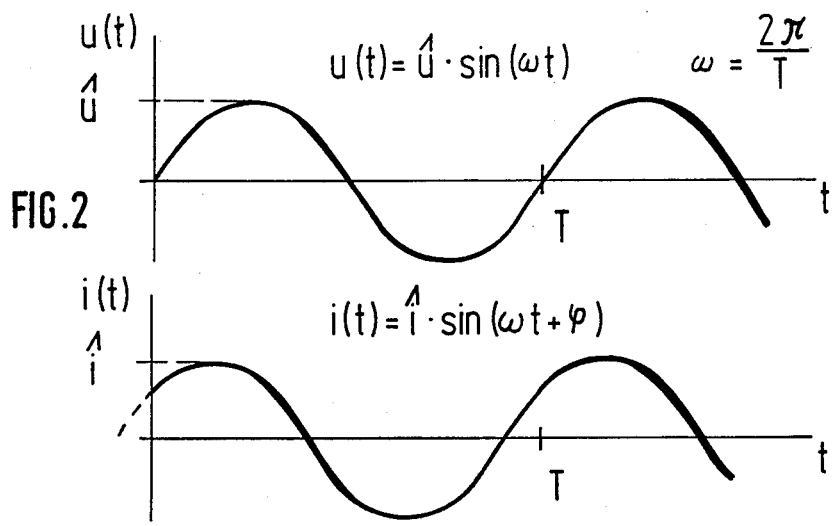
FIG. 2 is a diagrammatic view showing the relationship of voltage and current relative to time.

FIG. 2 shows the voltage phase $u(t) = \hat{u} \cdot \sin(\omega t)$. The maximum voltage is established by $\hat{u}$ and the power supply frequency is indicated by $\omega$. The power supply frequency is computed from the formula $\omega = 2\pi/T$, wherein T is the power supply period. Furthermore, the current phase follows the equation:

$$i(t) = \hat{i} \cdot \sin(\omega t + \phi)$$

and this corresponds to the capacitive burden. Lagging current would correspond to an inductive burden. The maximum current is indicated by $\hat{i}$. $\phi$ represents the angle of the phase shifting from current and voltage. For in-phase current, quadrature current, and the wattage factor, the following equations apply:

Pure in-phase current: $i_1 = \hat{i}_W \cdot \sin(\omega t)$

Pure quadrature current: $i_2 = \hat{i}_B \cdot \sin(\omega t + 90°)$
$= \hat{i}_B \cdot \cos(\omega t)$ Mixed: $i = i_1 + i_2 = \hat{i}_W \cdot \sin(\omega t) + \hat{i}_B \cdot \cos(\omega t)$
$= A \cdot \sin(\omega t + \phi)$ whereby $A = \hat{i} = \sqrt{i_W^2 + i_B^2}$ and $\phi = \arctan\frac{\hat{i}_B}{\hat{i}_W}$ These already established connections are placed before the description of the process method itself.

Figure 3:
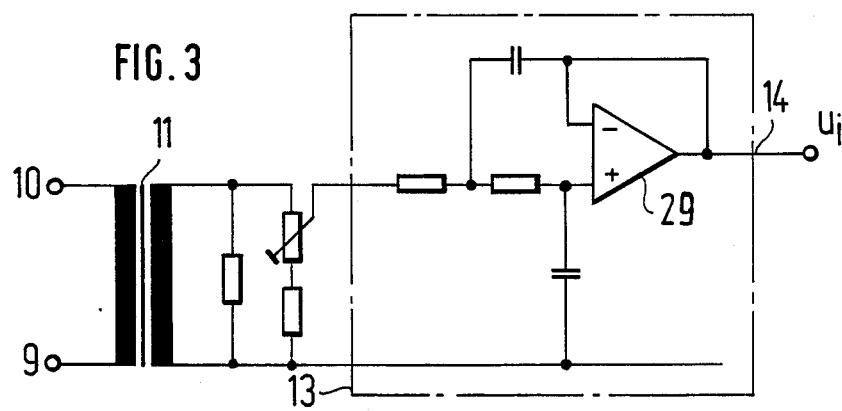
FIG. 3 is a schematic view of a portion of the measuring apparatus.

FIG. 3 shows the current transformer 11 and the low pass filter 13 according to FIG. 1 in an actual construction. The primary side terminals 9 and 10 correspond to those of FIG. 1. The output of the transformer is a voltage proportional to the input current:

$$u_i(t) = m_i \cdot \hat{i} \cdot \sin(\omega t + \phi) + U_{io}$$

A phase shift of the low pass filter does not need to be further included in this calculation because a filter of the same dimension is fitted in the voltage path with which this phase shifting compensates. $m_i = \Delta u_i / \Delta_i$ is the transformer constant of the current transformer, $U_{io}$ is the same voltage position which can, for example come from the offset voltage of the operational amplifier 29. Advantageously, the circuit arrangement is dimensioned so that the same voltage portion is imposed on the half of the supply voltage for the operation booster 29 which saves a negative supply voltage for the operation booster 29. This is also very favorable for the other circuits. As will be shown later, the results of the processing methods will not have errors induced when using this same voltage portion.

Figure 4:
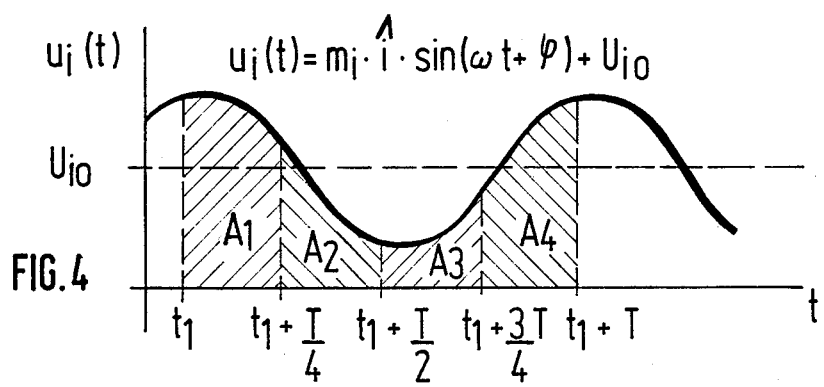
FIG. 4 is a further view showing a voltage relaive to time.

FIG. 4 shows the voltage $u_i(t)$ at the output 14 of the operational booster 29. As already described, the same voltage portion $U_{io}$ is also inputted. A sychronizing signal will be shunted at any given point in time $t_1$ from the voltage signal $U_{io}$. This signal is represented in FIG. 1 by the positive switch side of the output of the comparator 7. From this pont in time, four integrations of the signals $u_i(t)$ from each one-quarter wave of the period deviation will be passed through to the microprocessor. The integrals are referred to as $A_1$, $A_2$, $A_3$, and $A_4$.

$$A_1 = \int_{t_1}^{t_1 + \frac{T}{4}} u_i(t) dt$$

$$= \int_{t_1}^{t_1 + \frac{T}{4}} [m_i \cdot \hat{i} \cdot \sin(\omega t + \phi) + U_{io}] dt$$

$$= \frac{T}{4} \cdot U_{io} - m_i \cdot \hat{i} \cdot \frac{1}{\omega} [\cos(\omega t + \phi)] \Big|_{t_1}^{t_1 + T/4}$$

$$A_1 = \frac{T}{4} \cdot U_{io} - \frac{m_i \cdot \hat{i}}{\omega} \cdot \cos\left(\omega t_1 + \omega \frac{T}{4} + \phi\right) + \frac{m_i \cdot \hat{i}}{\omega} \cdot \cos(\omega t_1 + \phi)$$

$$A_2 = \int_{t_1 + \frac{T}{4}}^{t_1 + \frac{T}{2}} u_i(t) dt$$

From this, the integral calculates:

$$A_2 = \frac{T}{4} \cdot U_{io} - \frac{m_i \cdot \hat{i}}{\omega} \cdot \cos\left(\omega t_1 + \omega \frac{T}{2} + \phi\right) + \frac{m_i \cdot \hat{i}}{\omega} \cdot \cos\left(\omega t_1 + \omega \frac{T}{4} + \phi\right)$$

The following applies to integrates $A_3$ and $A_4$:

$$A_3 = \frac{T}{4} \cdot U_{io} - \frac{m_i \cdot \hat{i}}{\omega} \cdot \cos\left(\omega t_1 + \omega \frac{3T}{4} + \phi\right) + \frac{m_i \cdot \hat{i}}{\omega} \cdot \cos\left(\omega t_1 + \omega \frac{T}{2} + \phi\right)$$

$$A_4 = \frac{T}{4} \cdot U_{io} - \frac{m_i \cdot \hat{i}}{\omega} \cdot \cos(\omega t_1 + \omega T + \phi) +$$

-continued $$\frac{m_i \cdot \hat{i}}{\omega} \cdot \cos\left(\omega t_1 + \omega \frac{3T}{4} + \phi\right)$$

From these four integrals, the following two expressions are formed:

$$B_1 = -A_1 - A_2 + A_3 + A_4$$

$$B_2 = +A_1 - A_2 - A_3 + A_4$$

After insertion and calculation with the previously given integral values:

$$B_1 = -4 \frac{m_i \cdot \hat{i}}{\omega} \cdot \cos(\omega t_1 + \phi)$$

$$B_2 = +4 \frac{m_i \cdot \hat{i}}{\omega} \cdot \sin(\omega t_1 + \phi)$$

Now, for example, $\omega t_1 = \pi/2 = \omega T/4$, therefore, $t_1 = T/4$ is presented in the circuit example represented here exists in the junction in the voltage transformer 1 on the phase junctions L2, L3 and in the current transformer 11 in the phase L1 so that for this it is special:

$$B_1 = +4 \frac{m_i \cdot \hat{i}}{\omega} \cdot \sin\phi$$

$$B_2 = +4 \frac{m_i \cdot \hat{i}}{\omega} \cdot \cos\phi$$

According to the conformities described at the beginning:

$$i = \sqrt{\hat{i}_W^2 + \hat{i}_B^2} \text{ and } \phi = \arctan\frac{i_B}{i_W}$$

inserted in the expressions $B_1$ and $B_2$ it yields:

$$B_1 = 4 \cdot \frac{m_i}{\omega} \cdot \sqrt{\hat{i}_W^2 + \hat{i}_B^2} \cdot \sin\left(\arctan\frac{i_B}{i_W}\right)$$

$$B_1 = 4 \cdot \frac{m_i}{\omega} \cdot \hat{i}_B$$

and $$B_2 = 4 \cdot \frac{m_i}{\omega} \cdot \sqrt{\hat{i}_W^2 + \hat{i}_B^2} \cdot \cos\left(\arctan\frac{\hat{i}_B}{i_W}\right)$$

$$B_2 = 4 \cdot \frac{m_i}{\omega} \cdot \hat{i}_W$$

It is to be recognized that the processing expression $B_1$ and $B_2$ according to the invention represent the quadrature and in-phase current portions as separate up unti the constant factor $4m_i/\omega$. It is further important to notice that the same voltage portion $U_{io}$ has been cancelled and therefore has no influence on the result.

The determined quadrature and in-phase current portion can then be read separately with the help of a measuring instrument. Further, it is possible, by means of a calculation through the microprocessor, to fix the voltage $\cos\phi$ and afterwards to read the value.

Following, a conclusion of the single steps for determining the quadrature and in-phase currents as well as wattage factors are listed:

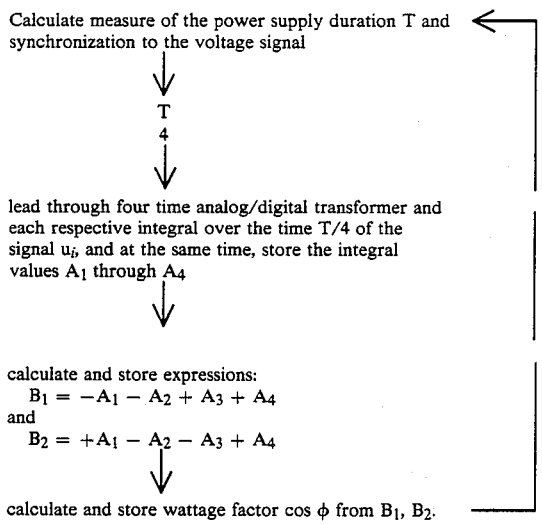

It has been shown that with an alternating curent power supply with an operational frequency 50 Hz, repetition of those steps after 100 msec is sufficient.

The process method according to the invention makes possible an extremely simple circuit expense and eliminates disadvantageous effects from same voltage portions of operation boosters. The determined measure values have a high level of exactness. The derivations of the expressions $B_1$ for the quadrature current portion and $B_2$ for the in-phase currelnt portion are not influenced by the over-wave, because it is shown that they are sufficiently stabilized by the low pass filters 5 and 13.

We claim:

1. A circuit arrangement for measuring in-phase and quadrature current in an electrical alternating current power supply comprising:
   first circuit means for generating a first electrical signal proportional to the in-phase and quadrature current of said power supply;
   second circuit means for generating a second electrical signal corresponding to the voltage of said alternating current power supply, said second electrical signal having a predetermined period;
   third circuit means for generating four integral values $A_1$, $A_2$, $A_3$, and $A_4$ in response to said first and second electrical signal; and
   fourth circuit means for determining the quadrature and in-phase current from said four integral values wherein said quadrature current is derived from the arithmetic combination $B_1 = -A_1 + A_2 + A_3 - A_4$ and wherein said in-phase current is derived from the arithmetic combination $B_2 = -A_1 - A_2 + A_3 + A_4$.

2. The circuit arrangement of claim 1, wherein said fourth circuit means includes circuit arrangment further comprises an analog/digital transformer, and said third circuit means includes a switch operable to enable the integration of said four integral values.

3. The circuit arrangement of claim 2, wherein said analog/digital transformer uses charge equalization for conversion.

4. The circuit arrangement of claim 3, wherein said analog/digital transformer includes a microprocessor operable to determine a wattage factor from the values of the quadrature and in-phase current.

5. The circuit arrangement of claim 1, wherein said power supply develops alternating current of a given period and wherein said second circuit means comprises a voltage transformer, a low pass filter, and a comparator, said circuit arrangement further comprising a microprocessor operable to determine said period of said power supply form said second electrical signal.

6. The circuit arrangement of claim 1, wherein said first circuit means comprises a first low pass filter, and said second circuit means comprises a second low pass filter substantially identical to said first low pass filter.

7. A method for measuring in-phase current and quadrature current in an electrical alternating current power supply, using a signal proportional to the power supply current characterized in that a signal corresponding to the power supply voltage is formed with the power supply period duration T, and that the signal proportional to the power supply current is integrated in four time segments of equal size, that four integral values $$A_1 = \int_{t_1}^{t_1 + \frac{T}{4}} u_i(t)dt, \quad A_2 = \int_{t_1 + \frac{T}{4}}^{t_1 + \frac{T}{2}} u_i(t)dt,$$

-continued $$A_3 = \int_{t_1 + \frac{T}{2}}^{t_1 + \frac{3T}{4}} u_i(t)dt, \quad A_4 = \int_{t_1 + \frac{3T}{4}}^{t_1 + T} u_i(t)dt$$

are formed, and that the quadrature current and in-phase current are determined by these four integral values, in such a way, that (a) in case of a three-phase current power supply having phases L2, L2 and L3 said signal proportional to the power supply current is shunted from phase L1, and that the signal corresponding to the power supply voltage is shunted from the phases L2 and L3 and that the four integral values $A_1$, $A_2$, $A_3 A_4$ for determining quadrature current according to the equation $B_1 = -A_1, -A_2, +A_3, +A_4$ and for in-phase current determination according to the reference $B_2 = +A_1, -A_2, -A_3, +A_4$ are arithmetically combined, and that (b) in case of a single phase power supply, the signal proportional to the power supply current and the signal corresponding to the power supply voltage are derived from the same phase, and that said four integral values for determining the quadrature current according to the reference $B_1 = -A_1 + A_2 + A_3 - A_4$ and for the in-pase current determination according to the equation $B_2 = -A_1 - A_2 + A_3 + A_4$ are arithmetically combined.

* * * * *

UNITED STATES PATENT AND TRADEMARK OFFICE
CERTIFICATE OF CORRECTION

PATENT NO. : 4,814,696

DATED : March 21, 1989

INVENTOR(S) : Kern, et al

Sheet 1 of 2

It is certified that error appears in the above-identified patent and that said Letters Patent is hereby corrected as shown below:

On the Title Page Under "Other Publications", "U." should be --d.--.

Abstract, line 5, after "such" insert --a manner--.

Column 2, line 1, "necessarly" should be --necessary--.

Column 2, line 26, "relaive" should be --relative--.

Column 2, line 38, delete "is" (second occurrence).

Column 4, line 19, "pont" should be --point--.

Column 4, line 34, ". i ." should be --. $\hat{i}$ .--.

Column 5, line 38, "$\dfrac{i_B}{i_W}$" should be --$\dfrac{\hat{i}_B}{\hat{i}_W}$--.

Column 5, line 45, "$\dfrac{i_B}{i_W}$" should be --$\dfrac{\hat{i}_B}{\hat{i}_W}$--.

Column 5, line 61, "unti" should be --until--.

Column 6, line 10, "$\dfrac{T}{4}$" should be --$\dfrac{\overline{T}}{4}$--.

UNITED STATES PATENT AND TRADEMARK OFFICE
CERTIFICATE OF CORRECTION

PATENT NO. : 4,814,696  Sheet 2 of 2
DATED : March 21, 1989
INVENTOR(S) : Kern, et al It is certified that error appears in the above-identified patent and that said Letters Patent is hereby corrected as shown below:

Column 6, line 27, "curent" should be --current--.

Column 6, line 36, "currelnt" should be --current--.

Column 6, line 62, Claim 2, "arrangment" should be --arrangement--.

Column 6, lines 62-63, Claim 2, delete "includes circuit arrangement".

Column 7, line 12, Claim 5, "form" should be --from--.

Column 8, line 12, Claim 7, "L2" (first occurrence) should be --L1--.

Column 8, line 17, Claim 7, "$A_3A_4$" should be --$A_3$, $A_4$--.

Column 8, line 29, Claim 7, "in-pase" should be --in-phase--.

Signed and Sealed this

Nineteenth Day of March, 1991

Attest:

HARRY F. MANBECK, JR.

*Attesting Officer*  *Commissioner of Patents and Trademarks*